United States Patent [19]

Lee

[11] Patent Number: 5,686,342
[45] Date of Patent: Nov. 11, 1997

[54] METHOD FOR INSULATING SEMICONDUCTOR ELEMENTS

[75] Inventor: Seoksoo Lee, Kyungsangbuk-do, Rep. of Korea

[73] Assignee: LG Semicon Co., Ltd., Cheongju, Rep. of Korea

[21] Appl. No.: 511,206

[22] Filed: Aug. 4, 1995

[30] Foreign Application Priority Data

Aug. 4, 1994 [KR] Rep. of Korea ............... 94-19254

[51] Int. Cl.⁶ .............................................. H01L 21/76
[52] U.S. Cl. ...................... 437/62; 437/61; 437/26; 437/974; 216/56
[58] Field of Search ........................ 437/62, 61, 63, 437/974, 26; 216/56; 156/662.1

[56] References Cited

U.S. PATENT DOCUMENTS

| | | | |
|---|---|---|---|
| 4,104,090 | 8/1978 | Pogge . | |
| 4,532,700 | 8/1985 | Kinney et al. | 437/62 |
| 4,810,667 | 3/1989 | Zorinsky et al. | 437/62 |
| 5,023,200 | 6/1991 | Blewer et al. | 437/62 |

*Primary Examiner*—Trung Dang
*Attorney, Agent, or Firm*—Loudermilk & Associates

[57] ABSTRACT

A method for insulating semiconductor elements is disclosed. The method includes steps of: forming a 3-layer semiconductor substrate consisting of an upper conductive layer, a high concentration impurity layer, and a lower conductive layer; carrying out a photo etching to remove the upper conductive layer, thereby opening the high concentration impurity layer; dipping the semiconductor substrate into an aqueous HF solution of a certain ratio, and carrying out an anodizing reaction to convert the high concentration impurity layer into a porous silicon layer; and carrying out a wet oxidation to convert the porous silicon layer into a buried oxide layer.

8 Claims, 2 Drawing Sheets

METHOD FOR INSULATING SEMICONDUCTOR ELEMENTS

FIELD OF THE INVENTION

The present invention relates to methods for insulating semiconductor elements, and more particularly to methods in which semiconductor elements are insulated from each other and from a substrate.

BACKGROUND OF THE INVENTION

In a semiconductor manufacturing technique in which semiconductor elements are directly formed upon a substrate, the semiconductor operating characteristics are significantly affected by the insulating technique by which semiconductor unit elements are insulated from each other and the substrate.

That is, if the insulation between semiconductor elements or between semiconductor elements and the substrate is not perfect, parasitic capacitance may be increased, with the result that the operating speed of the semiconductor device may be limited. Further, a latch-up phenomenon can occur between the semiconductor elements, with the result that the operating characteristics of the semiconductor device become unstable.

FIG. 1 is a sectional view illustrating a semiconductor structure formed by a conventional technique. This conventional technique will be described below referring to FIG. 1.

In the conventional insulating technique for insulating between unit elements, an oxidation is locally carried out in a selective manner. This local oxidation method, or "LOCOS" for the local oxidation of silicon, is carried out in the following manner. An oxide layer and a nitride layer are formed upon a semiconductor substrate in the cited order, and an element isolating region is defined using photoresist. An etching process is carried out to etch the oxide layer and the nitride layer, and an impurity is ion-implanted. Field oxide layer 11 is formed so that the elements of the device are insulated from each other upon the semiconductor substrate.

That is, in the most widely used conventional insulating technique applied to manufacturing semiconductor devices, the inter-element insulating method applied upon semiconductor substrate 10 is carried out in the following manner. A channel stop impurity is ion-implanted into element isolating region A, which is formed upon semiconductor substrate 10. Field oxide layer 11 is formed by applying the selective oxidation method. The insulation between the elements and semiconductor substrate 10 is realized in the following manner. An impurity is doped into the surface of semiconductor substrate 10, and the insulation between the elements and the semiconductor substrate is realized by a contact concentration difference between the impurity concentration of impurity region 13 and the impurity concentration of semiconductor substrate 10.

In this conventional insulating method, however, the vertical insulation which is based on the contact concentration difference between the unit elements and the semiconductor substrate may exhibit bad insulating characteristics, with the result that the parasitic capacitance is increased. Further, the area of the field oxide layer which is required for planar insulation between the unit elements can be very large, with the result that the density is lowered, and the operating speed of the semiconductor device is limited. Consequently, the operating characteristics of the semiconductor device may become unstable.

SUMMARY OF THE INVENTION

An object of the present invention is to provide a method for insulating semiconductor elements, in which the above described disadvantages of the conventional technique may be overcome, and the operating characteristics of the semiconductor device may be improved.

In achieving the above object, the method for insulating semiconductor elements according to the present invention includes the steps of: forming a 3-layer semiconductor substrate consisting of an upper conductive layer for forming elements, a high concentration impurity layer for conversion into a buried oxide layer, and a lower conductive layer for serving as a semiconductor substrate; carrying out an etching to open the middle layer of the 3 layer semiconductor substrate, i.e., the high concentration impurity layer; dipping the semiconductor substrate (with the high concentration impurity layer opened) into an aqueous HF solution of a certain ratio; carrying out an anodizing reaction to convert only the high concentration impurity layer into a porous silicon layer; and carrying out a wet oxidation to convert the porous silicon layer into a buried oxide layer, whereby insulation is formed between unit elements and between the unit elements and the semiconductor substrate.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

The present invention will be described by way of certain preferred embodiments referring to FIG. 2. In order to manufacture a semiconductor substrate having a buried oxide layer, a high concentration impurity is doped into the semiconductor substrate and is diffused, thereby forming a high concentration impurity layer. Thus, there is formed a 3-layer semiconductor substrate which consists of an upper conductive layer, a high concentration impurity layer and a lower conductive layer, the layers being arranged in the cited order.

That is, the semiconductor substrate is subjected to a wet oxidation process at a temperature of about 1000° C. for about 30 minutes so as to grow oxide layers to a thickness of about 2500 Angstroms on the opposite faces of the semiconductor substrate. In order to remove the oxide layer grown on the bottom face of the semiconductor substrate, photoresist is coated on the top face of the semiconductor substrate. The substrate then is dipped into a 10:1 aqueous HF solution for about 10 minutes.

Figure 1:
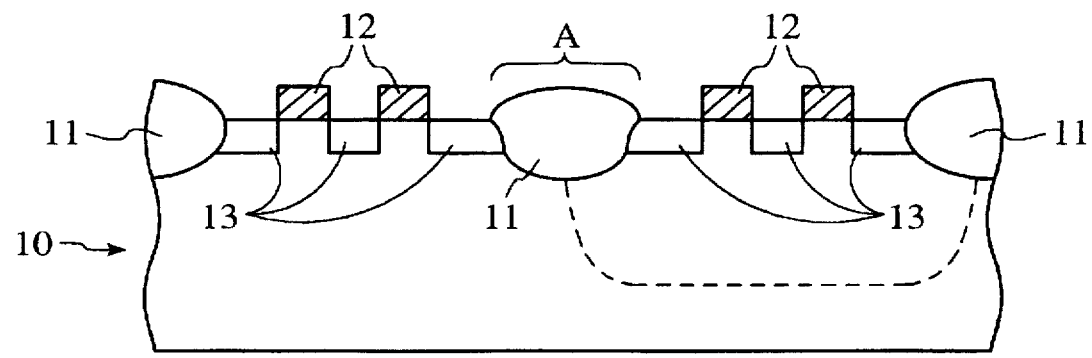
FIG. 1 illustrates the sectional structure of a semiconductor substrate in which elements are insulated based on a conventional method.
Figure 2A:
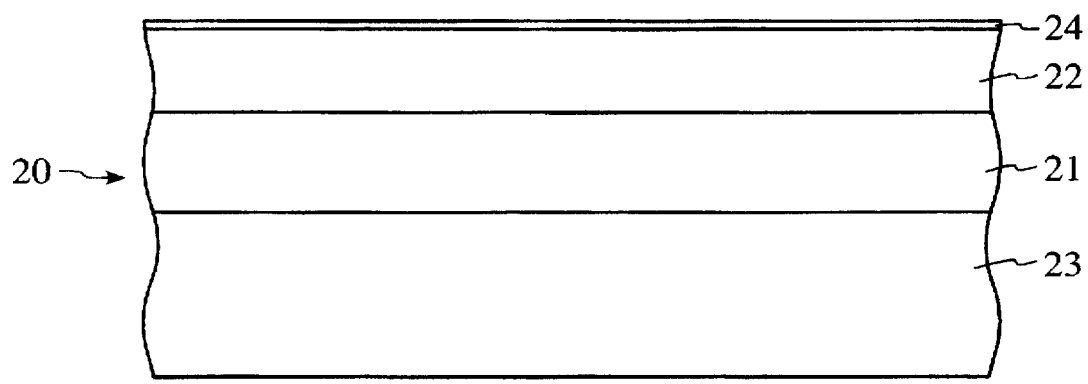
FIGS. 2 A–E illustrate the steps and resulting structure of a semiconductor element insulating process according to the present invention.

A illustrated in FIG. 2A, a high concentration ion impurity is ion-implanted into semiconductor substrate 20, and a thermal diffusion is carried out, thereby forming high concentration impurity layer 21 to a thickness of about 3 micrometers. Thus there is formed a 3-layer semiconductor substrate consisting of upper conductive layer 22, high concentration impurity layer 21 and lower conductive layer 23, such as is illustrated in FIG. 2A. Oxide layer 24 is formed on upper conductive layer 22.

Figure 2B:
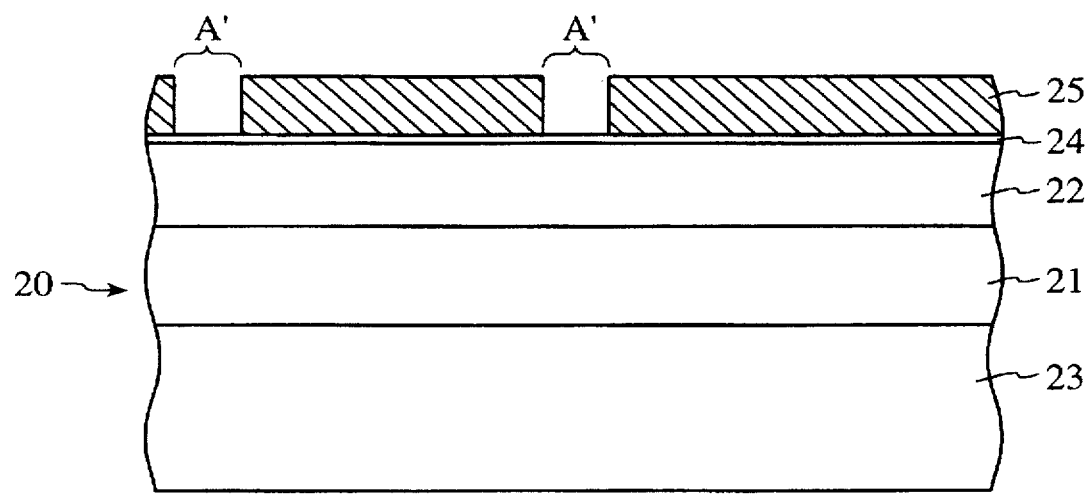

As illustrated in FIG. 2B, photoresist is coated on the whole surface of semiconductor substrate 20 so as to form photoresist film 25, and the portion of photoresist film 25 on the desired locations of element isolating regions is subjected to a photo process, thereby defining element isolating regions A'.

Figure 2C:
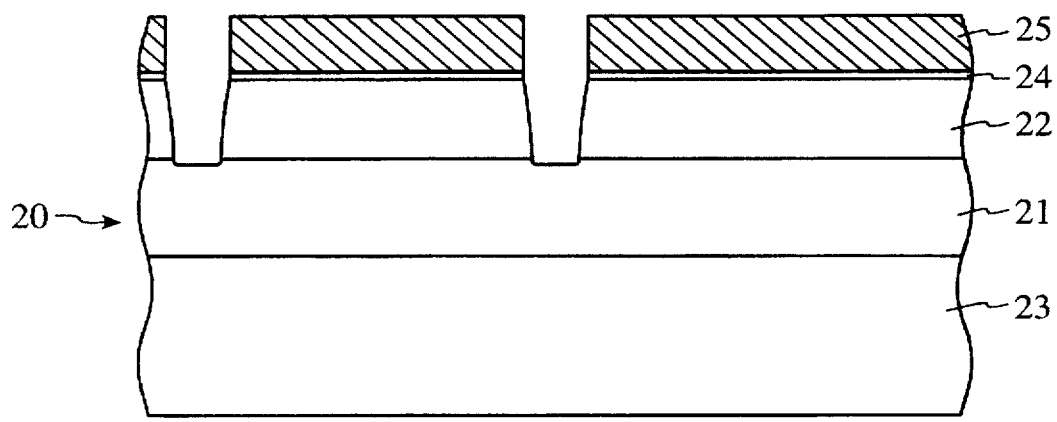

As illustrated in FIG. 2C, oxide layer 24 of element isolating regions A' which has been formed on the surface of semiconductor substrate 20 is removed. A dry etching is carried out to etch upper conductive layer 22 so as to open high concentration impurity layer 21, which has been formed as a middle layer of the 3-layer substrate.

Figure 2D:
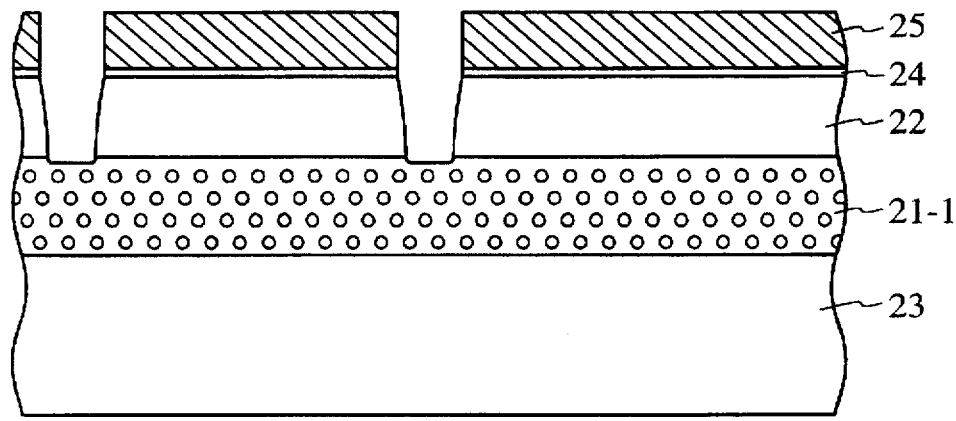

Semiconductor substrate 20 is dipped into an aqueous HF solution of about 30 weight %, and, at the same time, a voltage of about 3 volts is supplied between semiconductor substrate 20 and an electrode of a voltage source in a manner to carry out an anodizing reaction. As illustrated in FIG. 2D, the middle layer of semiconductor substrate 20, i.e., high concentration impurity layer 21, is converted into porous silicon layer 21-1 in a selective manner.

Under this condition, the aqueous HF solution and high concentration impurity layer 21 undergo resistant contacts to cause anodizing reactions, whereby high concentration impurity layer 21 is converted into porous silicon layer 21-1.

Figure 2E:
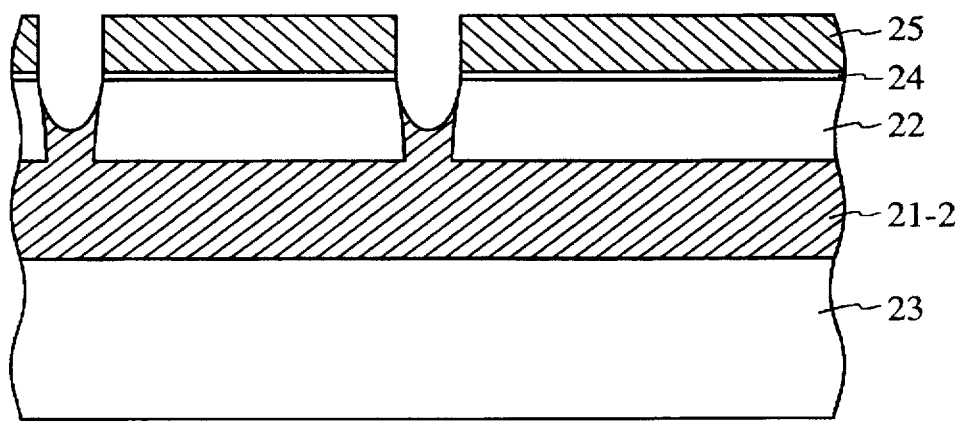

As illustrated in FIG. 2E, semiconductor substrate 20 is subjected to a wet oxidation at a temperature of about 900° C. for about 80 minutes, whereby porous silicon layer 21-1 formed in the middle layer of semiconductor substrate 20 is converted into buried oxide layer 21-2.

According to the semiconductor element insulating method of the present invention as described above, the insulation between the unit elements and between the unit elements and the semiconductor substrate are realized by a buried oxide layer.

Therefore, the insulating characteristics may be superior, and the parasitic capacitance may be decreased, with the result that the operating speed of the semiconductor device may be improved. Further, the area for realizing the planar insulation may be reduced. In addition, the problem of latch-up between the unit elements may be solved, and the semiconductor device characteristics may become more stable.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for insulating semiconductor elements on a semiconductor substrate having top and bottom faces, comprising the steps of:
   (1) forming first oxide layers on the top and bottom faces of the semiconductor substrate;
   (2) protecting the top face of the semiconductor substrate with a photoresist material, and removing the first oxide layer formed on the bottom face of the semiconductor substrate;
   (3) removing the photoresist material from the top face of the semiconductor substrate, implanting high concentration impurity ions into the semiconductor substrate, and thermally diffusing the high concentration impurity ions, wherein the semiconductor substrate comprises an upper conductive layer, a high concentration impurity layer, and a lower conductive layer, wherein the high concentration impurity layer is positioned between the upper conductive layer and the lower conductive layer, and forming a second oxide layer on the upper conductive layer;
   (4) defining an element isolating region on the semiconductor substrate;
   (5) removing the second oxide layer in the element isolating region, and removing the upper conductive layer in the element isolating region;
   (6) carrying out an anodizing reaction, wherein the high concentration impurity layer is converted into a porous silicon layer; and
   (7) carrying out a wet oxidation, wherein the porous silicon layer is converted into a buried oxide layer.

2. The method of claim 1, wherein:
   at step (1), the semiconductor substrate is subjected to a wet oxidation at a temperature of about 1000° C. for about 30 minutes to form the first oxide layers to a thickness of about 2500 Angstroms on the top and bottom faces of the semiconductor substrate;
   at step (2), in order to remove the first oxide layer on the bottom face of the semiconductor substrate, the semiconductor substrate with photoresist material protecting the top face is dipped into an about 10:1 aqueous HF solution for about 10 minutes; and
   at step (3), the high concentration impurity layer is formed to a thickness of about 3 micrometers.

3. The method of claim 1, wherein:
   at step (6), the semiconductor substrate is dipped into an aqueous HF solution of about 30 weight % with a voltage of about 3 volts supplied to carry out an anodizing reaction for about 2 minutes; and
   at step (7), the semiconductor substrate is subjected to a wet oxidation at a temperature of about 900° C. for about 80 minutes.

4. The method of claim 1, wherein:
   at step (1), the semiconductor substrate is subjected to a wet oxidation at a temperature of about 1000° C. for about 30 minutes to form the first oxide layers to a thickness of about 2500 Angstroms on the top and bottom faces of the semiconductor substrate.

5. The method of claim 1, wherein:
   at step (2), in order to remove the first oxide layer on the bottom face of the semiconductor substrate, the semiconductor substrate with photoresist material protecting the top face is dipped into an about 10:1 aqueous HF solution for about 10 minutes.

6. The method of claim 1, wherein:
   at step (3), the high concentration impurity layer is formed to a thickness of about 3 micrometers.

7. The method of claim 1, wherein:
   at step (6), the semiconductor substrate is dipped into an aqueous HF solution of about 30 weight % with a voltage of about 3 volts supplied to carry out an anodizing reaction for about 2 minutes.

8. The method of claim 1, wherein:
   at step (7), the semiconductor substrate is subjected to a wet oxidation at a temperature of about 900° C. for about 80 minutes.

* * * * *